(12) United States Patent
Vigouroux et al.

(10) Patent No.: US 7,716,393 B2
(45) Date of Patent: *May 11, 2010

(54) NETWORK CHIP DESIGN FOR GRID COMMUNICATION

(75) Inventors: Xavier-Francois Vigouroux, Lieu Dit le Montiou (FR); Bernard Tourancheau, Miribel (FR); Cedric Koch-Hofer, Saint Martin D'heres (FR)

(73) Assignee: Oracle America, Inc., Redwood Shores, CA (US)

( * ) Notice: Subject to any disclaimer, the term of this patent is extended or adjusted under 35 U.S.C. 154(b) by 530 days.

This patent is subject to a terminal disclaimer.

(21) Appl. No.: 11/148,495

(22) Filed: Jun. 9, 2005

(65) Prior Publication Data

US 2006/0224796 A1    Oct. 5, 2006

(30) Foreign Application Priority Data

Mar. 8, 2005    (EP) ................................. 05300168

(51) Int. Cl.
*H01L 23/00* (2006.01)

(52) U.S. Cl. ................. 710/33; 710/1; 710/62; 712/10; 438/15; 257/499

(58) Field of Classification Search ............... 710/15, 710/62
See application file for complete search history.

(56) References Cited

U.S. PATENT DOCUMENTS

| | | | | |
|---|---|---|---|---|
| 5,093,804 A | * | 3/1992 | Cieri et al. ................... 710/61 |
| 5,266,059 A | * | 11/1993 | Taylor ......................... 439/70 |
| 5,333,733 A | * | 8/1994 | Murata ........................ 206/714 |
| 5,451,763 A | * | 9/1995 | Pickett et al. ................. 235/492 |
| 5,568,356 A | | 10/1996 | Schwartz |
| 5,585,676 A | * | 12/1996 | Uda et al. .................... 257/786 |
| 5,634,080 A | * | 5/1997 | Kikinis et al. ................. 710/73 |
| 5,786,979 A | | 7/1998 | Douglass |
| 6,373,708 B1 | * | 4/2002 | Ando et al. ................... 361/737 |
| 6,502,231 B1 | * | 12/2002 | Pang et al. .................... 716/17 |
| 6,812,046 B2 | * | 11/2004 | Drost et al. ................... 438/14 |
| 6,870,271 B2 | * | 3/2005 | Sutherland et al. ........... 257/777 |
| 6,958,538 B1 | * | 10/2005 | Lauterbach et al. .......... 257/723 |
| 7,148,074 B1 | * | 12/2006 | Drost et al. ................... 438/15 |
| 7,170,121 B1 | * | 1/2007 | Lauterbach et al. .......... 257/288 |
| 7,200,830 B2 | * | 4/2007 | Drost et al. ................... 716/12 |

(Continued)

OTHER PUBLICATIONS

Sun, Proximity Communication—the Technology, Sep. 2004, Sun Microsystems, pp. 1-3.*

(Continued)

*Primary Examiner*—Henry W. H. Tsai
*Assistant Examiner*—Cheng-Yuan Tseng
(74) *Attorney, Agent, or Firm*—Osha • Liang LLP

(57) ABSTRACT

A system includes a plurality of integrated circuits for propagating data between at least one central processing unit and another component of the system. The plurality of integrated circuits are configured for proximity I/O communication. The plurality of integrated circuits is configured such that data propagation through the plurality of integrated circuits is unaffected by a rotation of at least one of the plurality of integrated circuits by 90 degrees.

19 Claims, 8 Drawing Sheets

U.S. PATENT DOCUMENTS

| | | | |
|---|---|---|---|
| 7,525,199 B1 * | 4/2009 | Lauterbach et al. | 257/777 |
| 7,573,720 B1 * | 8/2009 | Drost et al. | 361/760 |
| 2003/0042602 A1 | 3/2003 | Drost | |
| 2005/0088246 A1 * | 4/2005 | Wood | 331/57 |
| 2005/0258528 A1 * | 11/2005 | Jensen et al. | 257/686 |
| 2006/0289620 A1 * | 12/2006 | Yamamoto et al. | 235/375 |
| 2007/0222055 A1 * | 9/2007 | Jensen et al. | 257/686 |
| 2008/0018000 A1 * | 1/2008 | Krishnamoorthy et al. | 257/797 |

OTHER PUBLICATIONS

Drost et al., Proximity Communication, Sep. 2004, IEEE Journal of Solid-State Circuits, vol. 39, No. 9, pp. 1529-1599.*

Drost et al., Electronic Alignment for Proximity Communications, Feb. 2004, IEEE ISSCC, pp. 1-10.*

Drost et al., Proximity Communication, 2003, IEEE CICC, pp. 469-472.*

* cited by examiner

US 7,716,393 B2

NETWORK CHIP DESIGN FOR GRID COMMUNICATION

STATEMENT REGARDING FEDERALLY SPONSORED RESEARCH OR DEVELOPMENT

The present invention was made with the support of the government of the United States under contract NBCH020055 awarded by the Defense Advanced Research Projects Administration. The United States government may have certain rights in the present invention.

BACKGROUND

A typical computer system includes several components that are collectively used by a user to perform various functions such as, for example, preparing and generating a document with a word processor application. With the computer system, the user may input data to a computing portion using peripheral devices such as a keyboard or a mouse. Data may also be provided to the computing portion using data storage media, e.g., a floppy disk or a CD-ROM. The computing portion, using memory and other internal components, processes both internal data and data provided to the computing portion by the user to generate data requested by the user. The generated data may be provided to the user via, for example, a display device or a printer.

The computing portion of a computer system typically includes various components such as, for example, a power supply, disk drives, and the electrical circuitry required to perform the necessary and requested operations of the computer system. The computing portion may contain a plurality of circuit boards on which various circuit components are implemented. For example, a computing portion designed to have enhanced sound reproducing capabilities may have a circuit board dedicated to implementing circuitry that specifically operates to process data associated with the reproduction of sound.

On a circuit board, a clock provides a reference of time to various integrated circuit (IC) packages that are connected onto the circuit board. Those skilled in the art will recognize that the integrated circuit packages may be used to house and support various types of integrated circuits (e.g., application specific integrated circuits (ASICs), field-programmable gate arrays (FPGAs), microprocessors, and digital logic chips). The integrated circuit packages communicate with one another, i.e., pass data, using wires or traces of conductive material (e.g., copper or gold) embedded in the circuit board.

SUMMARY

According to one aspect of one or more embodiments of the present invention, a system comprises: at least one central processing unit; at least one memory unit; and at least two integrated circuits configured to communicate with one another by proximity I/O communication, the at least two integrated circuits further configured to propagate data packets between the at least one central processing unit and the at least one memory unit, where at least one of the two integrated circuits is configured such that a rotation of the at least one of the two integrated circuits by 90 degrees does not effect the proximity I/O communication between the at least two integrated circuits.

According to another aspect of one or more embodiments of the present invention, a system comprises: at least one central processing unit; and a plurality of integrated circuits configured for proximity I/O communication and configured to propagate data packets between the at least one central processing unit and a component of the system, where data propagation between the at least one central processing unit and the component is unaffected by a rotation of at least one of the plurality of integrated circuits by 90 degrees.

According to another aspect of one or more embodiments of the present invention, a method of performing system operations comprises: propagating data to a switching fabric formed of a plurality of integrated circuits configured for proximity I/O communication; propagating the data though the switching fabric, where propagating the data through the switching fabric is unaffected by a rotation of at least one of the plurality of integrated circuits by 90 degrees; and propagating the data from the switching fabric.

According to another aspect of one or more embodiments of the present invention, a method of manufacturing a system comprises: configuring a plurality of integrated circuits to communicate by proximity I/O communication; connecting at least one central processing unit to the plurality of integrated circuits, where the plurality of integrated circuits is configured such that data propagation to and from the at least one central processing unit through the plurality of integrated circuits is unaffected by a rotation of at least one of the plurality of integrated circuits by 90 degrees.

Other aspects of the invention will be apparent from the following description and the appended claims.

DETAILED DESCRIPTION

Figure 1:
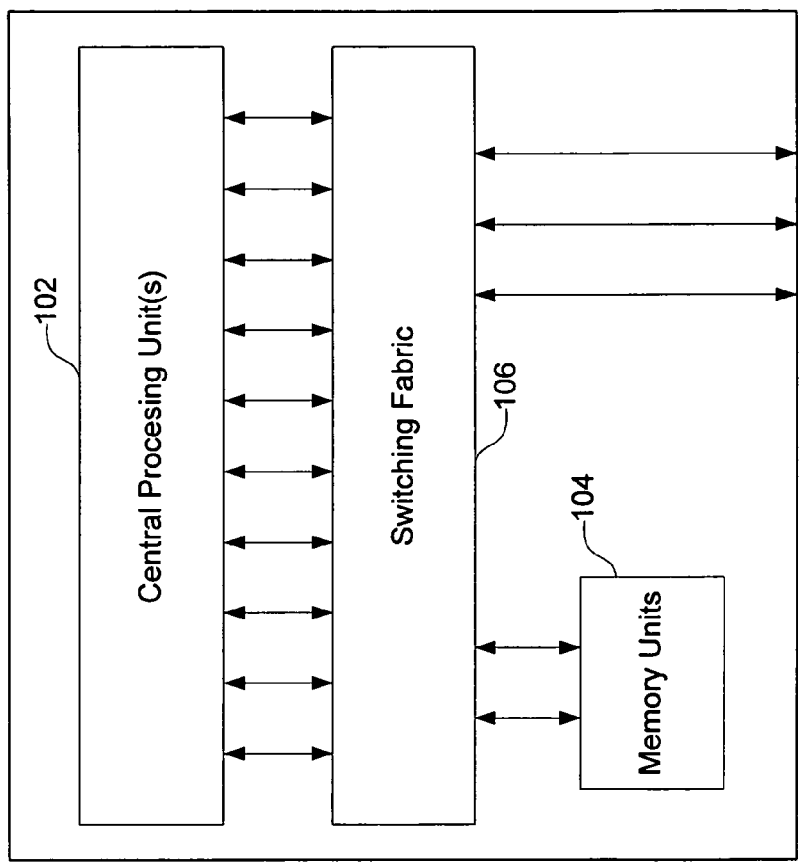
FIG. 1 shows a portion of a system in accordance with an embodiment of the present invention.

Exemplary embodiments of the invention will be described with reference to the accompanying drawings. Like items in the drawings are shown with the same reference numbers. Moreover, numerous specific details are set forth in the context of embodiments of the present invention in order to provide a more thorough understanding of the invention. In other instances, well-known features have not been described in detail to avoid obscuring the invention.

In an exemplary system in accordance with an embodiment of the present invention, the system is divided into a plurality of computing modules. As shown in FIG. 1, a module 100 includes one or more central processing units (CPUs) 102, one or more memory units 104 (e.g., cache memory, memory controllers), and a switching "fabric" 106 for switching data packets between, among other things, (i) the CPUs 102 and the memory units 104 and (ii) between module 100 and another module (not shown).

A switching "fabric," like that shown in FIG. 1, may be formed of a plurality of individual integrated circuits. In order to simplify the design of such a switching fabric, embodiments of the present invention relate to a technique for designing one or more integrated circuits for a switching fabric, where implementation and use of the integrated circuits within the switching fabric is invariant by rotation of one or more of the integrated circuits by 90 degrees. Further, embodiments of the present invention relate to a technique for designing one or more integrated circuits for a switching fabric, where implementation and use of the integrated circuits within the switching fabric is invariant to flipping one or more of the integrated circuits with respect to one of its diagonals.

Figure 2:
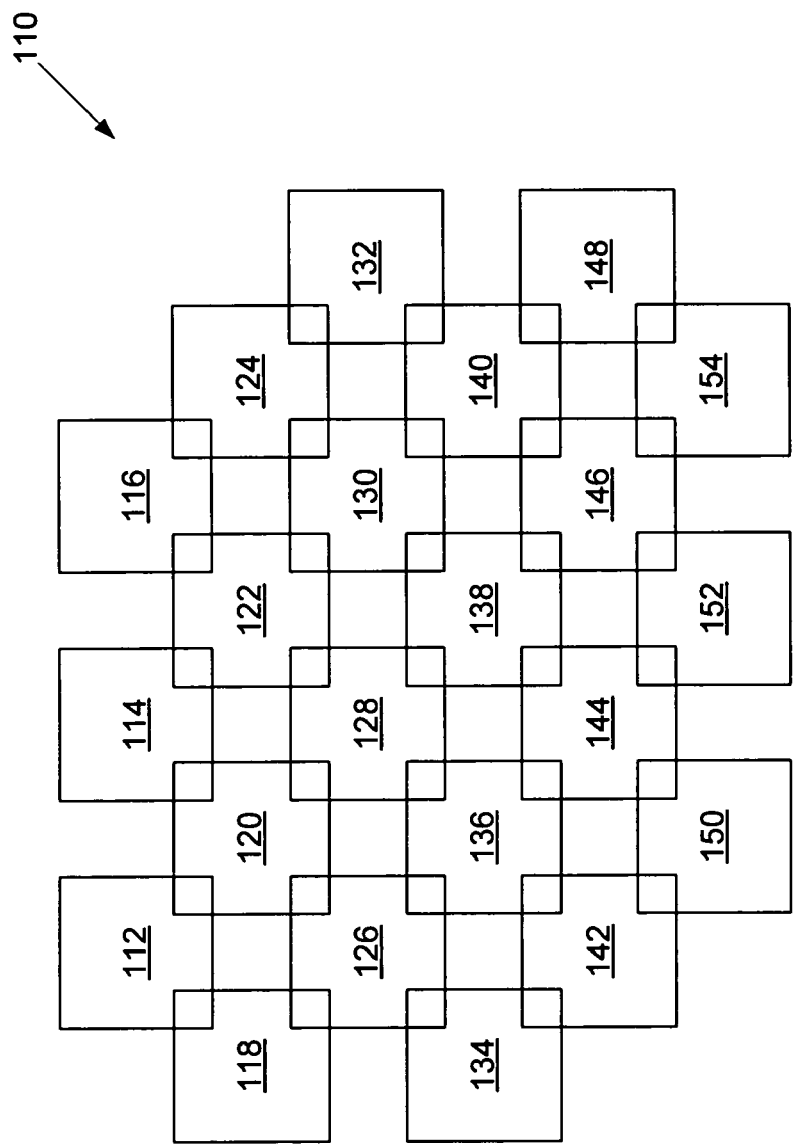
FIG. 2 shows a switching fabric in accordance with an embodiment of the present invention.

As shown in FIG. 2, an exemplary switching fabric 110 in accordance with an embodiment of the present invention is formed of individual integrated circuits 112, 114, 116, 118, 120, 122, 124, 126, 128, 130, 132, 134, 136, 138, 140, 142, 144, 146, 148, 150, 152, 154. Further, the overlapping corners of the individual integrated circuits 112-154 include regions configured for "proximity communication." Proximity communication is based on the observation that fast, low-cost communication is possible over short distances. Integrated circuits that are positioned for proximity communication are arranged such that transmitting and receiving circuits in the integrated circuits are aligned with only microns of distance between them.

Figure 3A:
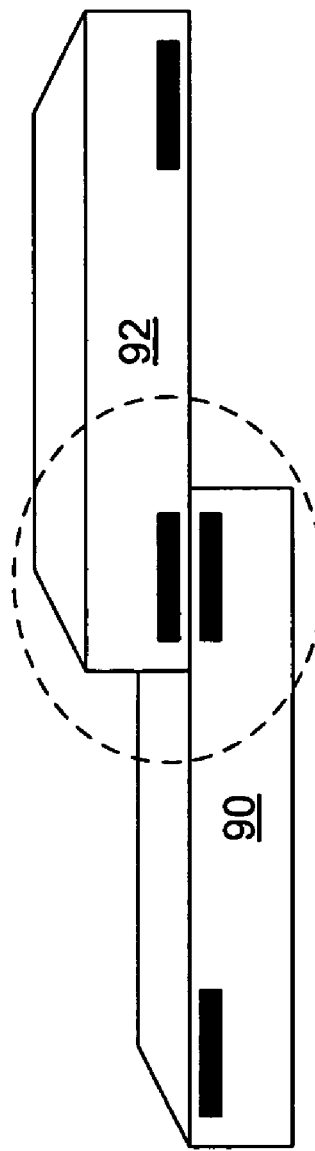
FIG. 3A shows integrated circuits configured for proximity communication.
Figure 3B:
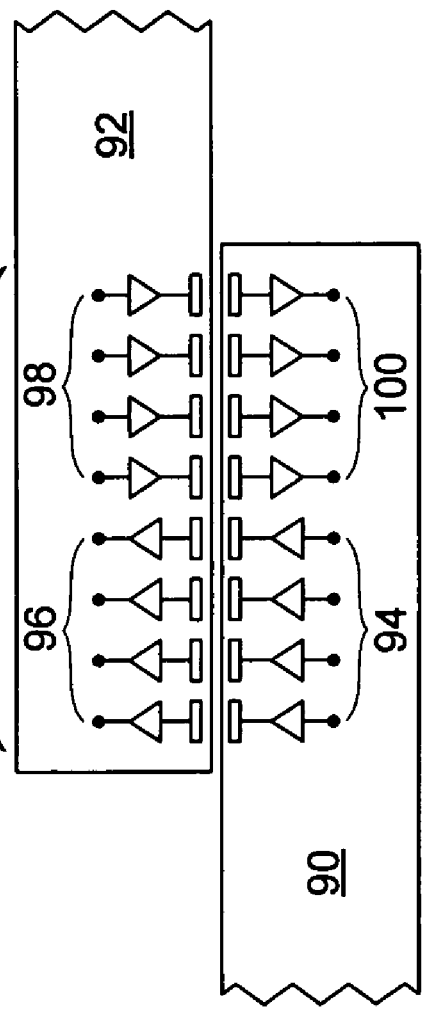
FIG. 3B shows an enlarged view of a portion shown in FIG. 3A.

FIGS. 3A and 3B show an exemplary embodiment of integrated circuits configured for proximity communication. In FIGS. 3A and 3B, a first integrated circuit 90 is positioned for "proximity I/O communication" with a second integrated circuit 92. In one embodiment, using a technique referred to as "capacitive coupling," data is capable of being transferred (i) from transmitting circuits 94 (forming a "sending region") of the first integrated circuit 90 to receiving circuits 96 (forming a "receiving region") of the second integrated circuit 92 and (ii) from transmitting circuits 98 (forming a "sending region") of the second integrated circuit 92 to receiving circuits 100 (forming a "receiving region") of the first integrated circuit 90. Capacitive coupling causes a voltage change on a transmitting circuit to induce a voltage change on a corresponding receiving circuit of the facing integrated circuit. This makes it possible to transmit signals directly between the integrated circuits without having to route the signal through intervening signal lines within a printed circuit board. One or more techniques for aligning integrated circuits for proximity I/O communication are described in U.S. Pat. Nos. 6,710,436 issued to Harris et al and 6,768,195 issued to Drost.

Those skilled in the art will note that in one or more embodiments of the present invention, proximity I/O communication may not be limited to capacitive coupling. For example, proximity I/O communication may be implemented using one or more of inductive coupling and electromagnetic coupling.

Figure 4:
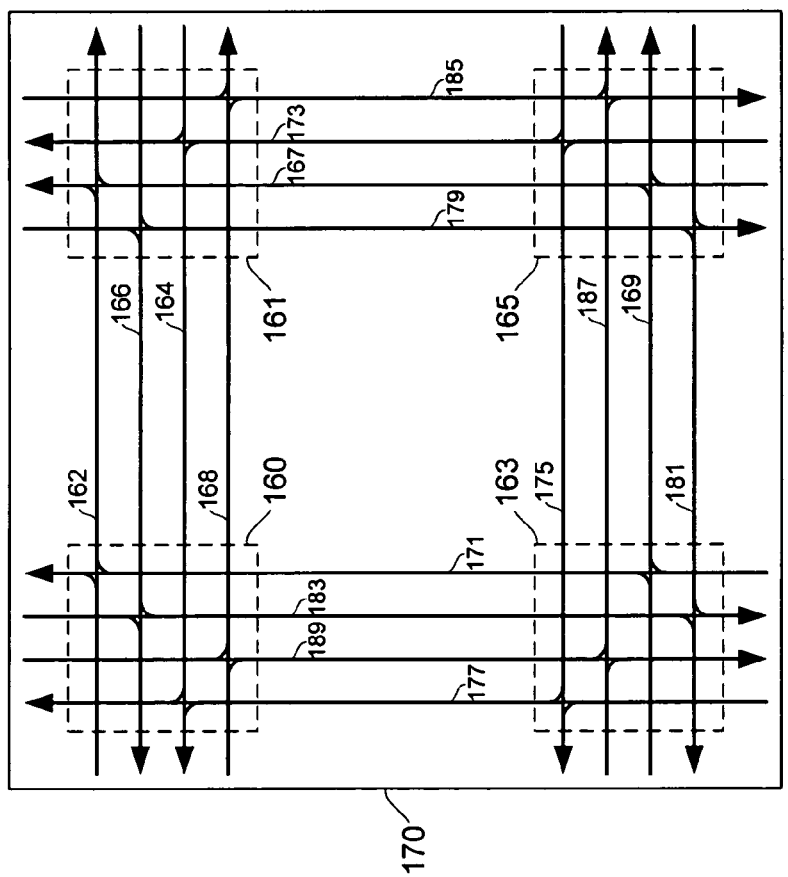
FIG. 4 shows an integrated circuit of a switching fabric in accordance with an embodiment of the present invention.

At least some, if not all, of the individual integrated circuits 112-154 (shown in FIG. 2) may be configured for proximity communication. Referring now to FIG. 4, one or more of the individual integrated circuits 112-154 (of FIG. 2) are described herein as having at least three components: proximity I/O regions 160, 161, 163, 165 at the corners; wires 162, 164, 166, 167, 168, 169, 171, 173, 175, 177, 179, 181, 183, 185, 187, 189; and switches (shown, but not labeled) selectively disposed (i) between wires 162, 164, 166, 167, 168, 169, 171, 173, 175, 177, 179, 181, 183, 185, 187, 189 and (ii) between wires 162, 164, 166, 167, 168, 169, 171, 173, 175, 177, 179, 181, 183, 185, 187, 189 and proximity I/O regions 160, 161, 163, 165. The proximity I/O regions 160, 161, 163, 165 of an exemplary integrated circuit (e.g., 136 in FIG. 2) are configured for proximity I/O communication with other integrated circuits (e.g., 128 in FIG. 2). As described above with reference to FIGS. 3A and 3B, the proximity I/O regions 160, 161, 163, 165 are divided into sending regions and receiving regions.

Wires 162, 164, 166, 167, 168, 169, 171, 173, 175, 177, 179, 181, 183, 185, 187, 189, positioned to link proximity I/O regions 160, 161, 163, 165, are used for communication within the integrated circuit 170. The wires 162, 164, 166, 167, 168, 169, 171, 173, 175, 177, 179, 181, 183, 185, 187, 189 shown in FIG. 4 represent four independent sub-networks, where each sub-network is formed of one or more wires interconnected by one or more switches. In the exemplary embodiment of FIG. 4, wires 162, 167, 169, 171 propagate data North and East (the "North-East" sub-network), wires 164, 173, 175, 177 propagate data North and West (the "North-West" sub-network), wires 166, 179, 181, 183 propagate data South and West (the "South-West" sub-network), and wires 168, 185, 187, 189 propagate data South and East (the "South-East" sub-network).

Those skilled in the art will note that the specific quantities of components described with reference to FIG. 4 are exemplary only. Accordingly, in one or more embodiments of the present invention, an integrated circuit of a switching fabric may have any number of sub-networks with any number of wires interconnected by any number of switches.

Still referring to FIG. 4, a 90-degree rotation of the integrated circuit 170 does not vary the layout of the wires. In other words, the arrangement of wires within the integrated circuit 170 for propagating data to/from North, East, South, and West is invariant to a 90-degree rotation of the integrated circuit 170 with respect to inputs and outputs of the integrated circuit 170.

Figure 5:
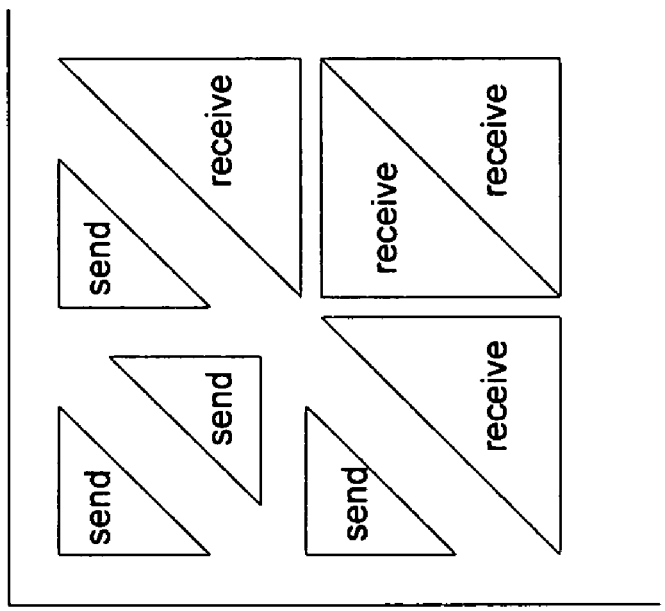
FIG. 5 shows a portion of an integrated circuit of a switching fabric in accordance with an embodiment of the present invention.

As described above, the proximity I/O regions 160, 161, 163, 165 are each divided into sending regions and receiving regions. After flipping an integrated circuit across one of its diagonals, the receiving regions should be in front of the sending regions. In other words, each type of proximity interconnect region (either sending or receiving) is different from the one of its image by the flipping across the diagonal. As there are four sub-networks entering and exiting each of the proximity I/O regions 160, 161, 163, 165 in integrated circuit 170, there are a total of eight sending and receiving regions. Exemplary sending and receiving regions of the North-West proximity I/O communication region are shown in FIG. 5. Those skilled in the art will note that the difference in size between the sending and receiving regions in FIG. 5 is shown for clarification purposes. In actual implementation, the sending and receiving regions may be of the same size or varying sizes and shapes.

Figure 6:
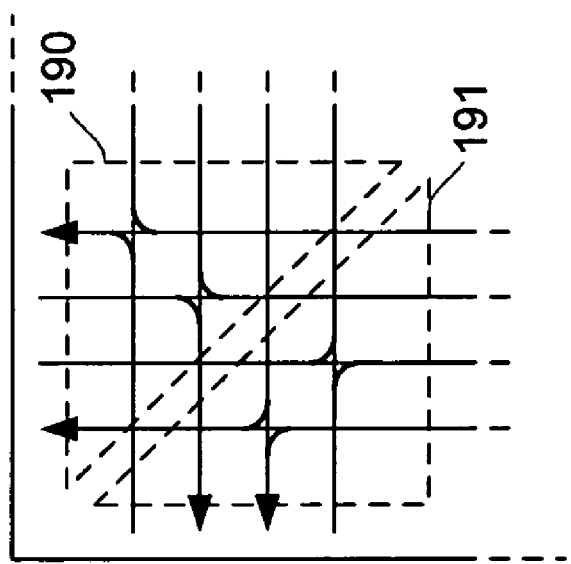
FIG. 6 shows a portion of an integrated circuit of a switching fabric in accordance with an embodiment of the present invention.

FIG. 6 shows a portion of an exemplary integrated circuit in accordance with an embodiment of the present invention. Particularly, FIG. 6 shows exemplary sending and receiving regions 190, 191 of a North-West proximity I/O communication region as exemplarily connected to wires and switches shown in FIG. 4.

Referring again to FIG. 4, switches (shown, but not labeled), located along each of wires 162, 164, 166, 168 are used to switch data packets within independent sub-network described above. For example, in the North-East sub-network, data received by a wire 162 is directed North and East by appropriate switches located along the wire 162. Those skilled in the art will note that the shown proximity I/O regions 160, 161, 163, 165 represent the sum of what belongs to two proximity I/O communication integrated circuits. Accordingly, for a particular proximity I/O communication region 160, 161, 163, 165 shown in FIG. 4, four switches for switching packets from any of the entry points to any of the two exit points are implemented between integrated circuit 170 and an integrated circuit (not shown) proximity I/O interconnected to integrated circuit 170 at the particular proximity I/O communication region 160, 161, 163, 165.

Figure 7:
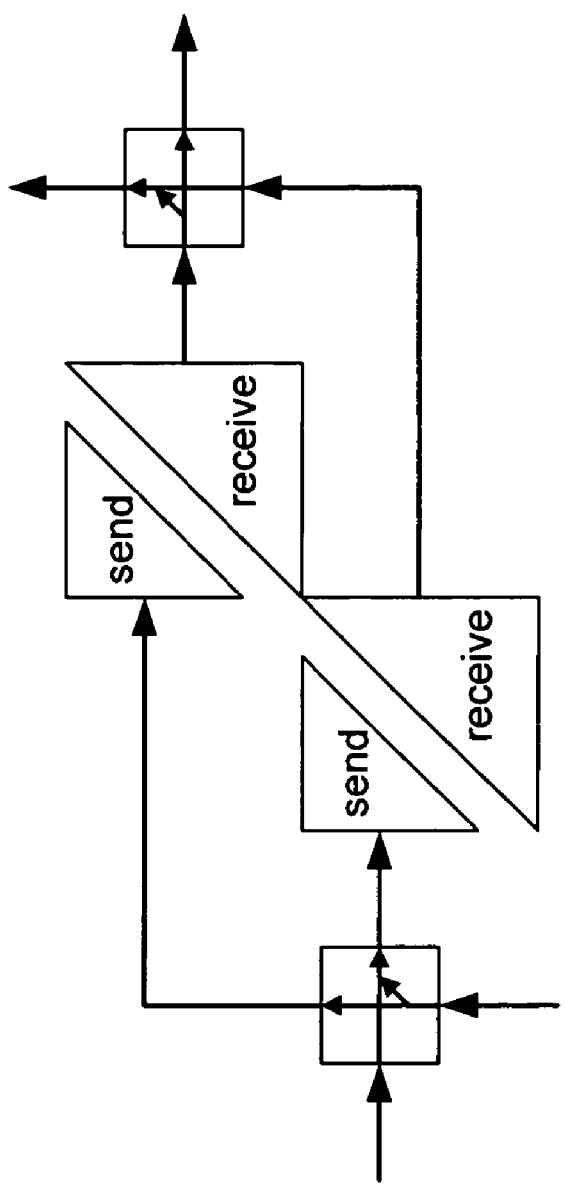
FIG. 7 shows a portion of an integrated circuit of a switching fabric in accordance with an embodiment of the present invention.

Switches (shown, but not labeled) are placed in a manner such that they are "balanced," i.e., a switch that is placed before a sending/receiving region corresponds to a switch that is placed after a receiving/sending so that there are no unnecessary switches. As shown in FIG. 4, four switches are present in each proximity I/O communication region 160, 161, 163, 165. FIG. 7 shows that each switch may be divided into two "half-switches" (1 to 2 way switches), where part of the necessary switching is configured to take place before a sending/receiving region (of a first integrated circuit) and part is configured to take place after a receiving/sending region (of a second integrated circuit proximity interconnected to the first integrated circuit). Those skilled in the art will note that in the arrangement shown in FIG. 7, paths traverse the same regions (or complementary regions) and the same number of logic gates, thereby having equal "costs" (in terms of, for example, latency, power, and area).

Figure 8:
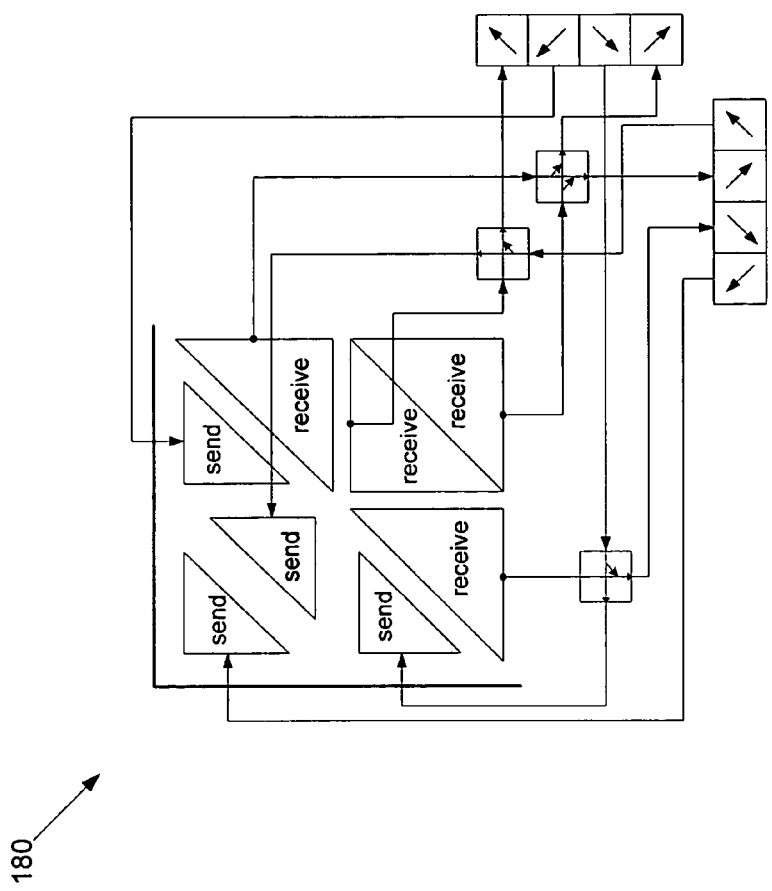
FIG. 8 shows an integrated circuit of a switching fabric in accordance with an embodiment of the present invention.

Linking the switches, proximity I/O communication regions, and wires is dependent on the layout of a particular integrated circuit in a switching fabric. FIG. 8 shows a portion of an integrated circuit 180 of a switching fabric in accordance with an embodiment of the present invention. Particularly, FIG. 8 shows the positioning of switches, proximity I/O communication regions, and wires for the North-West sub-network of the integrated circuit 180. The North-West sub-network has two exits (i.e., North and West are both exiting the integrated circuit 180 to cross the proximity I/O communication regions). As the image of the North-West sub-network by flipping across the diagonal extending from the bottom-left corner to the top-right corner of the integrated circuit 180 is the South-East sub-network, these two exits enter the South-East sub-network. The switch is a "full" switch that is either before or after the proximity I/O communication regions. The South-East sub-network image by the same flipping is the previous North-West sub-network and shares the "full" switch with it.

The North-East sub-network image by the same flipping is still the North-East sub-network. However, the North sub-network becomes the East sub-network. Thus, a North exit enters an East entry. A "half" switch is thus positioned to switch between North and West. The "half" switch is used before or after the proximity I/O communication regions depending on which sub-network the data comes from and which sub-network the data will propagate to.

The South-West sub-network remains unchanged by the flipping. The West sub-network becomes the South sub-network. Thus, a West exit is linked to a South entry.

Those skilled in the art will note that the specific quantities of components described with reference to FIGS. 4-8 are exemplary only. Accordingly, in one or more embodiments of the present invention, an integrated circuit of a switching fabric may have any number of sub-networks with any number of wires interconnected by any number of switches.

Further, in one or more embodiments of the present invention, because one or more integrated circuits for a switching fabric are invariant to 90-degree rotations, it may be possible to reduce the number of different chips to produce for the switching fabric.

Further, in one or more embodiments of the present invention, because one or more integrated circuits for a switching fabric are invariant to flipping the integrated circuits, it may be possible to reduce the number of different chips to produce for the switching fabric.

Further, in one or more embodiments of the present invention, because one or more integrated circuits for a switching fabric are invariant to 90-degree rotations, costs associated with the production of numerous integrated circuit masks may be reduced or avoided.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A system, comprising:
   a first integrated circuit (IC) having a center and comprising a first half of a switch, a first corner, a second corner adjacent to the first corner, a first proximity I/O communication (PIOC) region, and a second PIOC region, wherein the first PIOC region is disposed in the first corner and the second PIOC region is disposed in the second corner in orientations that differ by 90 degrees;
   a second IC having a perimeter and comprising a third corner and a second half of the switch,
   wherein the first IC is configured to communicate with the second IC in a first position using proximity I/O communication and in a second position using proximity I/O communication,
   wherein the first IC rotates 90 degrees about the center to move from the first position to the second position,
   wherein the first corner overlaps the third corner in the first position,
   wherein the second corner overlaps the third corner in the second position, and
   wherein the center is outside the perimeter in the first position and in the second position; and
   a central processing unit (CPU) operatively connected to a memory unit using the first IC and the second IC.

2. A method of performing system operations, comprising:
   propagating data to a switching fabric comprising:
      a first integrated circuit (IC) having a center and comprising a first corner, a second corner adjacent to the first corner, a first proximity I/O communication (PIOC) region, a second PIOC region, and a first half of a switch, wherein the first PIOC region is disposed in the first corner and the second PIOC region is disposed in the second corner in orientations that differ by 90 degrees; and
      a second IC having a perimeter and comprising a third corner and a second half of the switch,
      wherein the first IC is configured to communicate with the second IC in a first position and a second position,
      wherein the first IC rotates 90 degrees about the center to move from the first position to the second position,
      wherein the first corner overlaps the third corner in the first position,
      wherein the second corner overlaps the third corner in the second position, and
      wherein the center is outside the perimeter in the first position and in the second position; and propagating the data through the first IC and the second IC, wherein the first IC and the second IC communicate using proximity I/O communication; and propagating the data from the switching fabric.

3. A method of manufacturing a system, comprising:

disposing a first integrated circuit (IC) having a center and comprising a first corner, a second corner adjacent to the first corner, a first proximity I/O communication (PIOC) region, a second PIOC region, and a first half of a switch, wherein the first PIOC region is disposed in the first corner and the second PIOC region is disposed in the second corner in orientations that differ by 90 degrees;

disposing a second IC having a perimeter and comprising a third corner and a second half of the switch, wherein the first IC is configured to communicate with the second IC in a first position and a second position using proximity I/O communication, wherein the first IC rotates 90 degrees about the center to move from the first position to the second position, wherein the first corner overlaps the third corner in the first position, wherein the second corner overlaps the third corner in the second position, and wherein the center is outside the perimeter in both the first position and the second position; and connecting a central processing unit (CPU) to a memory unit using the first IC and the second IC.

4. A system, comprising:

a first integrated circuit (IC) comprising:

a first proximity I/O communication (PIOC) region positioned in a first orientation on a first corner of the first IC and comprising a plurality of proximity communication (PC) sending areas and a plurality of PC receiving areas;

a second PIOC region positioned in a second orientation on a second corner of the first IC, wherein the second orientation is a first rotation of the first orientation;

a third PIOC region positioned in a third orientation on a third corner of the first IC, wherein the third orientation is a second rotation of the first orientation;

a first plurality of wires operatively connecting the plurality of PC sending areas with the second PIOC region; and a second plurality of wires operatively connecting the plurality of PC receiving areas with the third PIOC region.

5. The system of claim 1, wherein the proximity I/O communication is dependent on at least one selected from a group consisting of capacitive coupling, inductive coupling, and electromagnetic coupling.

6. The system of claim 1, wherein the first IC further comprises:

a first wire configured to propagate a plurality of data packets between the first PIOC region and the second PIOC region, wherein the first half of the switch is for use in transferring the plurality of data packets on the first wire to a second wire.

7. The system of claim 6, wherein the first IC further comprises:

a third PIOC region, wherein the second wire is configured to propagate the plurality of data packets between the third PIOC region and at least one selected from a group consisting of the first PIOC region and the second PIOC region.

8. The method of claim 2, propagating the data through the switching fabric comprising:

propagating the data between the first PIOC region and the second PIOC region of the first IC.

9. The method of claim 8, propagating the data through the switching fabric further comprising:

transferring the data from a first wire connecting the first PIOC region and the second PIOC region of the first IC to a second wire connected to a third PIOC region of the first IC using the first half of the switch.

10. The method of claim 3, further comprising:

connecting a component to the first IC and the second IC, wherein the first IC and the second IC are configured to propagate data between the CPU and the component.

11. The method of claim 3, wherein the proximity I/O communication is dependent on at least one selected from a group consisting of capacitive coupling, inductive coupling, and electromagnetic coupling.

12. The system of claim 6, wherein the second IC further comprises:

a third PIOC region, wherein the second wire is located on the second IC and connects the second half of the switch to the third PIOC region.

13. The method of claim 8, propagating the data through the switching fabric further comprising:

transferring the data from a first wire connecting the first PIOC region and the second PIOC region of the first IC to a second wire connected to a third PIOC region of the second IC using the second half of the switch.

14. The system of claim 4, wherein at least one selected from a group consisting of the first rotation and the second rotation is 90 degrees.

15. The system of claim 4, wherein a cardinality of the first plurality of wires equals a cardinality of the plurality of PC sending areas.

16. The system of claim 4, further comprising:

a first half of a switch located on the first IC operatively connected to a first wire of the first plurality of wires and a second wire of the second plurality of wires.

17. The system of claim 16, further comprising:

a second IC comprising a second half of the switch and a fourth PIOC region, wherein the second half of the switch is operatively connected to the fourth PIOC region.

18. The system of claim 16, wherein the first IC and the second IC are disposed on a substrate.

19. The system of claim 4, wherein the plurality of PC sending areas are located on a first side of a diagonal of the first PIOC, and wherein the plurality of PC receiving areas are located on a second side of the diagonal of the first PIOC.

* * * * *